(12) United States Patent
Miao et al.

(10) Patent No.: US 9,369,130 B2
(45) Date of Patent: Jun. 14, 2016

(54) NONVOLATILE LOGIC GATE CIRCUIT BASED ON PHASE CHANGE MEMORY

(71) Applicant: Huazhong University of Science and Technology, Wuhan (CN)

(72) Inventors: Xiangshui Miao, Wuhan (CN); Yi Li, Wuhan (CN); Yingpeng Zhong, Wuhan (CN); Lei Xu, Wuhan (CN); Huajun Sun, Wuhan (CN); Xiaomin Cheng, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 14/706,004

(22) Filed: May 7, 2015

(65) Prior Publication Data

US 2015/0236697 A1 Aug. 20, 2015

Related U.S. Application Data

(63) Continuation-in-part of application No. PCT/CN2014/070943, filed on Jan. 21, 2014.

(30) Foreign Application Priority Data

Dec. 25, 2013 (CN) .......................... 2013 1 0727395

(51) Int. Cl.
*H03K 19/003* (2006.01)
*G11C 13/00* (2006.01)
*H03K 19/173* (2006.01)
*H03K 19/20* (2006.01)
*H03K 19/177* (2006.01)

(52) U.S. Cl.
CPC ...... *H03K 19/00346* (2013.01); *G11C 13/0004* (2013.01); *G11C 13/004* (2013.01); *H03K 19/1733* (2013.01); *H03K 19/17724* (2013.01); *H03K 19/20* (2013.01)

(58) Field of Classification Search
CPC ............. G11C 13/004; G11C 11/5678; G11C 11/1673; G11C 2013/0054; G11C 13/0004; H01L 45/085; H01L 45/06; H01L 45/1206; B82Y 10/00; H01H 1/0094; H03K 19/20; H03K 19/00346; H03K 19/1733; H03K 17/17724
See application file for complete search history.

(56) References Cited

U.S. PATENT DOCUMENTS

| | | | | |
|---|---|---|---|---|
| 2009/0052231 A1* | 2/2009 | Kurotsuchi | ........ | G11C 13/0004 365/163 |
| 2009/0129195 A1* | 5/2009 | De Brosse | ............... | G11C 7/12 365/230.06 |
| 2010/0067285 A1* | 3/2010 | Lung | .................. | G11C 11/5664 365/163 |
| 2014/0285226 A1* | 9/2014 | Li | ...................... | G11C 13/0002 324/705 |

* cited by examiner

*Primary Examiner* — Vibol Tan
(74) *Attorney, Agent, or Firm* — Matthias Scholl, PC; Matthias Scholl

(57) ABSTRACT

A nonvolatile logic gate circuit based on phase change memories, including a first phase change memory, a second phase change memory, a first controllable switch element and a first resistor, wherein a first end of the first phase change memory serves as a first input end of an AND gate circuit, a first end of the second phase change memory serves as a second input end of the AND gate circuit, a first end of the first controllable switch element is connected to a second end of the first phase change memory, a second end of the first controllable switch element is grounded; one end of the first resistor is connected to the first end of the second phase change memory, the other end of the first resistor is grounded; and the first end of the second phase change memory serves as an output end of the AND gate circuit.

4 Claims, 4 Drawing Sheets

NONVOLATILE LOGIC GATE CIRCUIT BASED ON PHASE CHANGE MEMORY

CROSS-REFERENCE TO RELATED APPLICATIONS

This application is a continuation-in-part of International Patent Application No. PCT/CN2014/070943 with an international filing date of Jan. 21, 2014, designating the United States, now pending, and further claims priority benefits to Chinese Patent Application No. 201310727395.0 filed Dec. 25, 2013. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

1. Field of the Invention

The invention relates to a field of microelectronic devices, and more particularly to a nonvolatile logic gate circuit based on phase change memories.

2. Description of the Related Art

Information storage and information processing are separated from each other in a traditional Von Neumann computer architecture, and memories for storing information communicate with processors for processing information via buses. However, with the advent of an era of Big Data, the so-called Von Neumann bottleneck, restraining further improvement of a computer's ability to process massive data in real time, still occurs in spite of continuous development of memories and processors, which means that neither information access speed of memories, nor information processing speed of processors, but limited data transmission speed of a bus connecting memories and processors restrains massive data transmission between memories and arithmetic units. The next generation of architecture and electronic devices combining information storage and processing is considered as an effective method for breaking through the bottleneck.

Current information processors are formed by logic gates of CMOS transistors as basic units, wherein data are processed based on logical level, and processed data are transmitted to and stored in special storage units such as internal memories and external memories. The logic gates, only capable of processing information while incapable of storing information, are inapplicable for future computer architecture combining storage and processing. Therefore, a nonvolatile logic gate circuit, capable of carrying out information processing such as Boolean logic operations and nonvolatile information storage, is required. A Chinese patent titled A Logic Gate Circuit Based on Memristors (application No. 201210234665.X, application date Jul. 9, 2012) discloses a device conducting logic operations based on nonvolatile change of resistance state of memristors. However, the circuit is inapplicable for large-scale production in market due to some unsolved problems concerning consistency and reliability of memristors, and current leakage and crosstalk in arrays.

SUMMARY OF THE INVENTION

In view of the above-mentioned problems, it is an objective of the invention to provide a logic gate circuit capable of conducting logic operations and nonvolatile information storage.

To achieve the above objective, according to one embodiment of the invention, there is provided a nonvolatile logic gate circuit based on phase change memories, comprising a first phase change memory, a second phase change memory, a first controllable switch element and a first resistor, wherein a first end of the first phase change memory serves as a first input end of an AND gate circuit, a first end of the second phase change memory serves as a second input end of the AND gate circuit, a first end of said first controllable switch element is connected to a second end of the first phase change memory and a second end of the second phase change memory, a second end of the first controllable switch element is grounded; one end of the first resistor is connected to the first end of the second phase change memory, the other end of the first resistor is grounded; and the first end of the second phase change memory serves as an output end of the AND gate circuit; in operation, logic AND operation is realized by turning on the first controllable switch element, and inputting logic 0 or 1 at the first input end, thereby bringing the first phase change memory to a high-resistance state or a low-resistance state, and inputting logic 0 or 1 at the second input end, thereby bringing the second phase change memory to a high-resistance state or a low-resistance state; and read operation is carried out by turning off the first controllable switch element, inputting a read pulse at the first input end, and outputting a result of AND operation through the output end of the AND gate circuit while the second input end is suspended.

In a class of this embodiment, resistance of the first resistor is in the same order of magnitude as that of the first phase change memory in a low-resistance state.

According to another embodiment of the invention, there is provided a nonvolatile logic gate circuit based on phase change memories, comprising a third phase change memory, a fourth phase change memory, a second controllable switch element and a second resistor, wherein a first end of the third phase change memory serves as a first input end of an OR gate circuit, a first end of the fourth phase change memory serves as a second input end of the OR gate circuit, a first end of the second controllable switch element is connected to a second end of the third phase change memory and a second end of the fourth phase change memory, a second end of the second controllable switch element is grounded; a first end of the second resistor is connected to the second end of the third phase change memory and the second end of the fourth phase change memory, a second end of the second resistor is grounded; and the second end of the third phase change memory serves as an output end of the OR gate circuit; in operation, logic OR operation is realized by turning on the second controllable switch element, and inputting logic 0 or 1 at the first input end, thereby bringing the third phase change memory to a high-resistance state or a low-resistance state, and inputting logic 0 or 1 at the second input end, thereby bringing the fourth phase change memory to a high-resistance state or a low-resistance state; and read operation is carried out by turning off the second controllable switch element, inputting a read pulse simultaneously at the first input end and the second input end, and outputting a result of OR operation through the output end of the OR gate circuit.

In a class of this embodiment, resistance of the second resistor is in the same order of magnitude as that of the third phase change memory in a low-resistance state.

According to another embodiment of the invention, there is provided a nonvolatile logic gate circuit based on phase change memories, comprising a fifth phase change memory and a third resistor, wherein a first end of the third resistor serves as a read input end of a NOT gate circuit, the third resistor and the fifth phase change memory are grounded in series, and a series connection end of the third resistor and the fifth phase change memory serves as a logic input end and an output end of the NOT gate circuit; in operation, logic NOT operation is realized by inputting logic 0 or 1 at the logic input end, thereby bringing the fifth phase change memory to a high-resistance state or a low-resistance state; and read operation is carried out by inputting a read pulse at the read input end and outputting a result of NOT operation through the output end of the NOT gate circuit.

In a class of this embodiment, resistance of the third resistor is in the same order of magnitude as that of the fifth phase change memory in a high-resistance state.

According to the invention, three basic Boolean logic operations AND, OR and NOT are facilitated based on nonvolatile resistance state changes caused by crystalline-amorphous phase change of phase change materials, and information storage and processing may be conducted in one logic gate circuit, which makes it possible to construct the next generation of a computer architecture combining information storage and processing, so as to break through a so-called Von Neumann bottleneck caused by separated information storage and processing in a traditional computer architecture.

DETAILED DESCRIPTION OF THE EMBODIMENTS

For clear understanding of the objectives, solutions and advantages of the invention, detailed description of the invention will be given below in conjunction with accompanying drawings and specific embodiments. It should be noted that the embodiments are only meant to explain the invention, and not to limit the scope of the invention. Furthermore, the technical features involved as described in the embodiments in the invention could be inter-combination if only there is no confliction between each other.

In view of the problems in prior art, the invention provides a nonvolatile logic gate circuit based on phase change memories, comprising three basic Boolean logic operations AND, OR and NOT, so as to carry out the combination of information storage and processing. Phase change memories are considered as a promising nonvolatile memory in the next generation featuring high access speed, high storage density and high erase time, and are going to experiencing large-scale and market-oriented production, and therefore are applicable for constructing nonvolatile logic gates.

Compared with prior art, the invention is able to achieve three basic Boolean logic operations AND, OR and NOT based on nonvolatile resistance state changes due to crystalline-amorphous phase change of phase change materials, and to carry out information storage and processing in one logic gate circuit, which may be used to construct the next generation of computer architecture combining information storage and processing, so as to break through Von Neumann bottleneck caused by separated information storage and processing in traditional computer architecture.

Accompanying drawings of exemplary embodiments are illustrated below for reference and for further illustrating the invention. However, the invention can be realized in various ways and should not be limited to the embodiments. More accurately, the embodiments are provided for full disclosure and clear understanding of the invention.

In the invention, a phase change memory, as a core element of a logic gate circuit, experiences phase change under the effect of Joule heat generated by current. A SET pulse representing logic 1 changes a phase change storage unit from amorphous state featuring high-resistance to crystalline state featuring low-resistance, and a RESET pulse representing logic 0 changes a phase change storage unit from crystalline state featuring low-resistance to amorphous state featuring high-resistance.

Figure 1A:
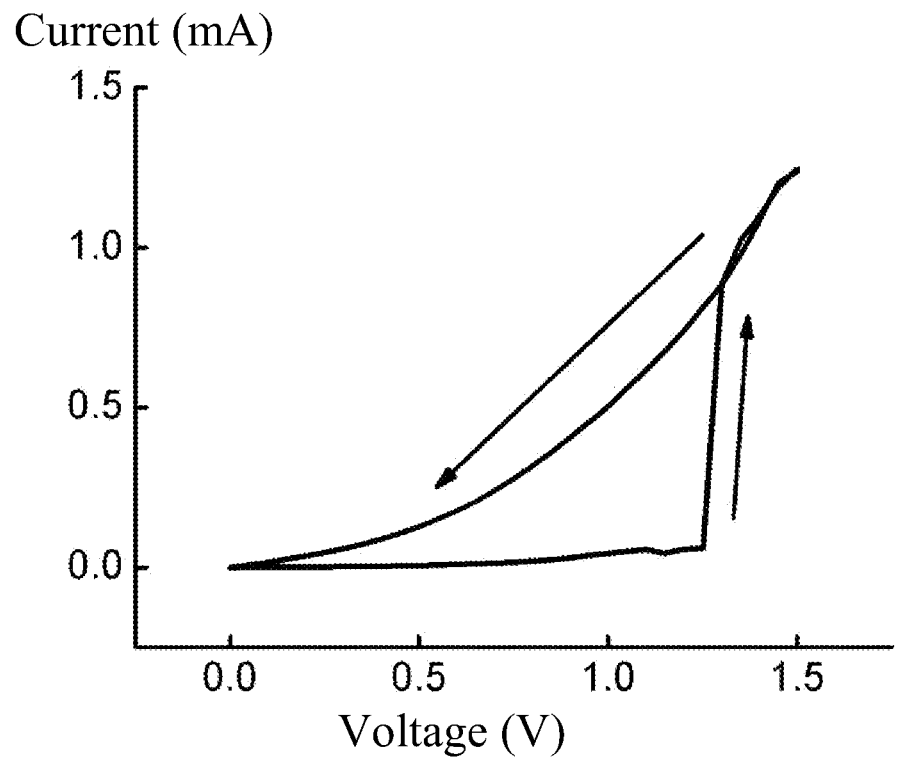
FIG. 1A is a typical I-V curve of a phase change memory according to one embodiment of the invention.

FIG. 1A is a typical I-V curve of a phase change memory according to one embodiment of the invention. Referring to FIG. 1A, the element is in amorphous state featuring high-resistance initially and changes to crystalline state featuring low-resistance when a voltage applied thereto is greater than a threshold. Both amorphous state featuring high-resistance and crystalline state featuring low-resistance are nonvolatile resistance state.

Figure 1B:
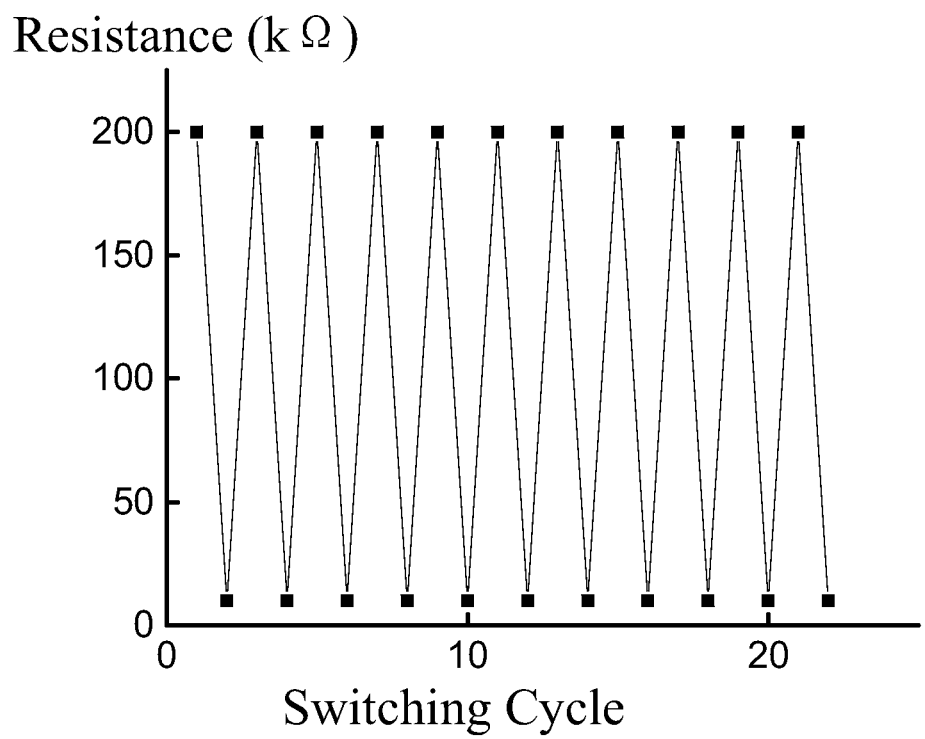
FIG. 1B is typical pulse switching curve of a phase change memory according to one embodiment of the invention.

FIG. 1B is typical pulse switching curve of a phase change memory according to one embodiment of the invention. Referring to FIG. 1B, the element changes from a high-resistance state to a low-resistance state when a SET pulse with an amplitude of 0.8 V and a width of 200 ns is applied thereto, and the element changes from a low-resistance state to a high-resistance state when a RESET pulse with an amplitude of 2 V and a width of 30 ns is applied thereto.

Figure 2:
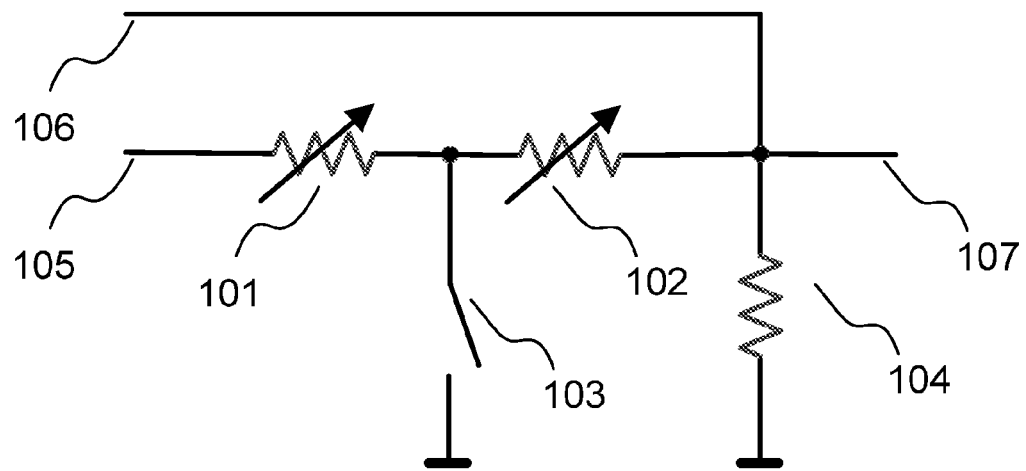
FIG. 2 is a schematic diagram of an AND gate circuit according to one embodiment of the invention.

FIG. 2 is a schematic diagram of an AND gate circuit based on phase change memories according to one embodiment of the invention. Referring to FIG. 2, the AND gate circuit based on phase change memories comprises a first phase change memory 101, a second phase change memory 102, a first controllable switch element 103 and a first resistor 104, wherein a first end of the first phase change memory 101 serves as a first input end 105 of the AND gate circuit, a first end of the second phase change memory 102 serves as a second input end 106 of the AND gate circuit, a first end of the first controllable switch element 103 is connected to a second end of the first phase change memory 101 and a second end of the second phase change memory 102, a second end of the first controllable switch element 103 is grounded; one end of the first resistor 104 is connected to the first end of the second phase change memory 102, the other end of the first resistor 104 is grounded; and the first end of the second phase change memory 102 serves as an output end 107 of the AND gate circuit.

Logic operation is realized by turning on the first controllable switch element 103, and inputting logic 0 or 1 at the first end 105 of the first phase change memory 101, thereby bringing the first phase change memory 101 to a high-resistance state or a low-resistance state, and inputting logic 0 or 1 at the first end 106 of the second phase change memory 102, thereby bringing the second phase change memory 102 to a high-resistance state or a low-resistance state. Read operation is carried out by turning off the first controllable switch element 103, inputting a read pulse at the first input end 105 of the first phase change memory 101, and outputting a result of AND operation through the output end 107 while the second input end 106 is suspended.

According to the embodiment of the invention, resistance of the first resistor 104 is in the same order of magnitude as that of the first phase change memory 101 and the second phase change memory 102 in a low-resistance state. When the first phase change memory 101 or the second phase change memory 102 is in a high-resistance state, namely logic 00, 01 or 10 is input, voltage drop of an input end is mainly imposed on the first phase change memory 101 or the second phase change memory 102, and output voltage drop of the first resistor 104 is extremely low. Only when both the first phase change memory 101 and the second phase change memory 102 are in a low-resistance state, namely logic 11 is input, resistance of the first phase change memory 101 and the second phase change memory 102 connected in series is comparatively low and is in the same order of magnitude as that of the first resistor 104, and output voltage drop of the first resistor 104 is comparatively high.

Figure 3:
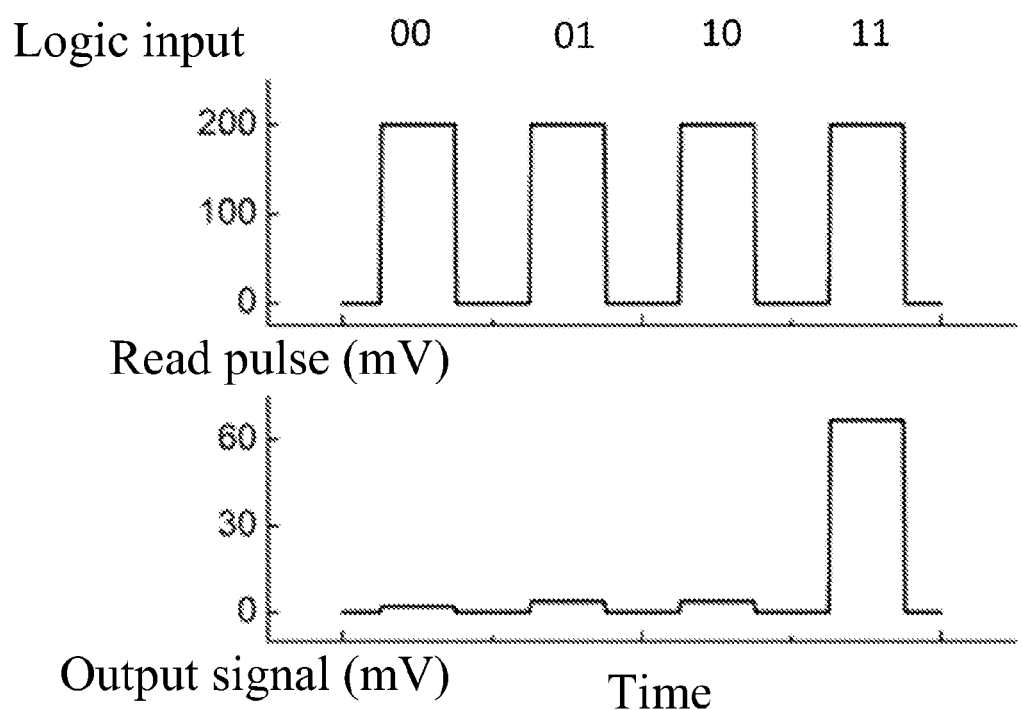
FIG. 3 illustrates testing waves of the AND gate circuit according to one embodiment of the invention.

FIG. 3 illustrates testing waves of the AND gate circuit according to one embodiment of the invention. Resistances of the first phase change memory 101 and the second phase change memory 102 in a high-resistance state and a low-resistance state are 200 kΩ and 10 kΩ respectively, and resistance of the first resistor 104 is 10 kΩ. A SET pulse representing logic 1 is a rectangular wave with an amplitude of 0.8 V and a width of 200 ns, and a RESET pulse representing logic 0 is also a rectangular wave with an amplitude of 2 V and a width of 30 ns.

Referring to FIG. 3, when logic 00 is input, resistance of the first phase change memory 101 is 200 kΩ and resistance of the second phase change memory 102 is also 200 kΩ. During read operation, a read pulse with an amplitude of 200 mV and a width of 10 ms is applied to the first end of the first phase change memory 101, and an output signal with an amplitude of 1.98 mV and a width of 10 ms is obtained at the first end of the second phase change memory 102. When logic 01 is input, resistance of the first phase change memory 101 is 200 kΩ and resistance of the second phase change memory 102 is 10 kΩ. During read operation, a read pulse with an amplitude of 200 mV and a width of 10 ms is applied to the first end of the first phase change memory 101, and an output signal with an amplitude of 3.85 mV and a width of 10 ms is obtained at the first end of the second phase change memory 102. When logic 10 is input, resistance of the first phase change memory 101 is 10 kΩ and resistance of the second phase change memory 102 is 200 kΩ. During read operation, a read pulse with an amplitude of 200 mV and a width of 10 ms is applied to the first end of the first phase change memory 101, and an output signal with an amplitude of 3.85 mV and a width of 10 ms is obtained at the first end of the second phase change memory 102. When logic 11 is input, resistance of the first phase change memory 101 is 10 kΩ and resistance of the second phase change memory 102 is also 10 kΩ. During read operation, a read pulse with an amplitude of 200 mV and a width of 10 ms is applied to the first end of the first phase change memory 101, and an output signal with an amplitude of 66.7 mV and a width of 10 ms is obtained at the first end of the second phase change memory 102.

Figure 4:
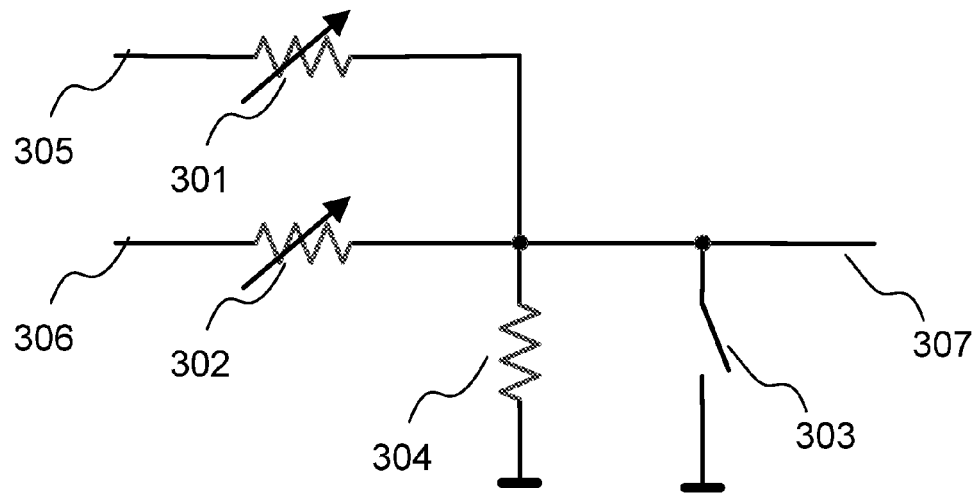
FIG. 4 is a schematic diagram of an OR gate circuit according to one embodiment of the invention.

FIG. 4 is a schematic diagram of an OR gate circuit based on phase change memories according to one embodiment of the invention. Referring to FIG. 4, the OR gate circuit based on phase change memories comprises a third phase change memory 301, a fourth phase change memory 302, a second controllable switch element 303 and a second resistor 304, wherein a first end 305 of the third phase change memory 301 serves as a first input end of the OR gate circuit, a first end 306 of the fourth phase change memory 302 serves as a second input end of the OR gate circuit, a first end of the second controllable switch element 303 is connected to a second end of the third phase change memory 301 and a second end of the fourth phase change memory 302, a second end of the second controllable switch element 303 is grounded; a first end of the second resistor 304 is connected to the second end of the third phase change memory 301 and the second end of the fourth phase change memory 302, a second end of the second resistor 304 is grounded; and a second end 307 of the third phase change memory 301 serves as an output end of the OR gate circuit.

Logic operation is realized by turning on the second controllable switch element 303, and inputting logic 0 or 1 at the first end 305 of the third phase change memory 301, thereby bringing the third phase change memory 301 to a high-resistance state or a low-resistance state, and inputting logic 0 or 1 at the first end 306 of the fourth phase change memory 302, thereby bringing the fourth phase change memory 302 to a high-resistance state or a low-resistance state.

Read operation is carried out by turning off the second controllable switch element 303, inputting a read pulse simultaneously at the first end of the third phase change memory 301 and the first end of the fourth phase change memory 302, and outputting a result of operation through the second end 307 of the third phase change memory 301.

According to the embodiment of the invention, resistance of the second resistor 304 is in the same order of magnitude as that of the third phase change memory 301 and the fourth phase change memory 302 in a low-resistance state. When both the third phase change memory 301 and the fourth phase change memory 302 are in a high-resistance state, namely logic 00 is input, voltage drop of an input end is mainly imposed on the third phase change memory 301 and the fourth phase change memory 302 and output voltage drop of the second resistor 304 is extremely low. When the third phase change memory 301 or the fourth phase change memory 302 is in a low-resistance state, namely logic 01, 10 or 11 is input, resistance of the third phase change memory 301 and the fourth phase change memory 302 connected in parallel is comparatively low and is in the same order of magnitude as that of the second resistor 304, and output voltage drop of the second resistor 304 is comparatively high.

Figure 5:
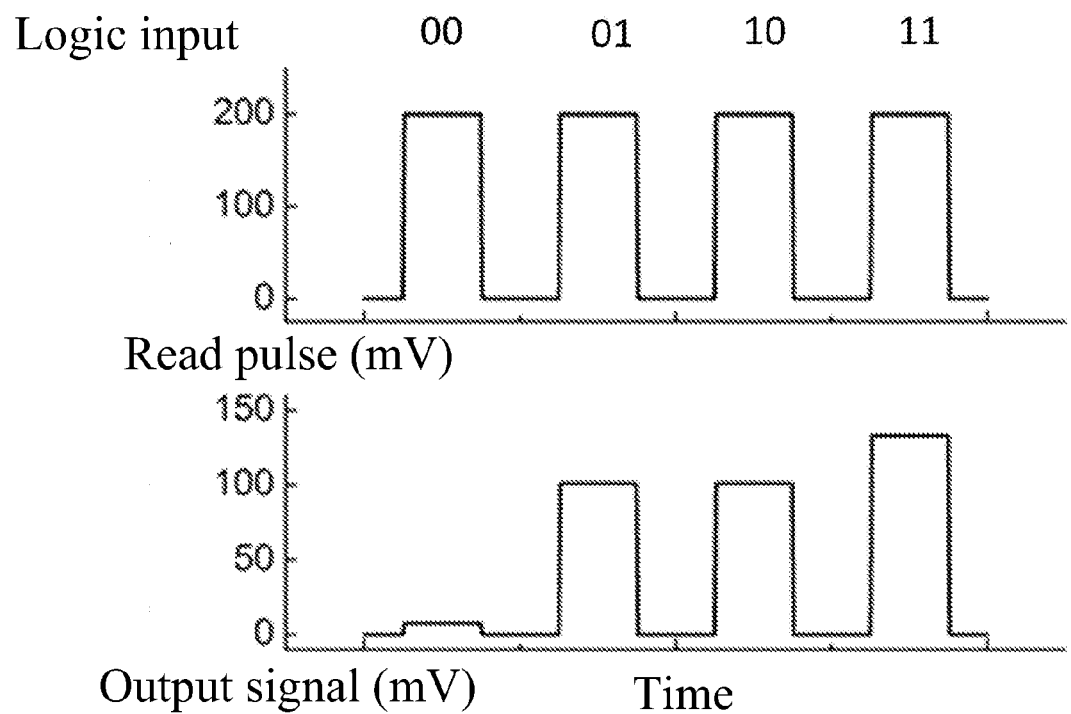
FIG. 5 illustrates testing waves of the OR gate circuit according to one embodiment of the invention.

FIG. 5 illustrates testing waves of the OR gate circuit according to one embodiment of the invention. Resistances of the third phase change memory 301 and the fourth phase change memory 302 in a high-resistance state and a low-resistance state are 200 kΩ and 10 kΩ respectively, and resistance of the second resistor 304 is 10 kΩ. A SET pulse representing logic 1 is a rectangular wave with an amplitude of 0.8 V and a width of 200 ns, and a RESET pulse representing logic 0 is also a rectangular wave with an amplitude of 2 V and a width of 30 ns.

Referring to FIG. 5, when logic 00 is input, resistance of the third phase change memory 301 is 200 kΩ and resistance of the fourth phase change memory 302 is also 200 kΩ. During read operation, a read pulse with an amplitude of 200 mV and a width of 10 ms is applied to the first end of the third phase change memory 301 and the first end of the fourth phase change memory 302, and an output signal with an amplitude of 7.69 mV and a width of 10 ms is obtained at the second end of the third phase change memory 301. When logic 01 is input, resistance of the third phase change memory 301 is 200 kΩ and resistance of the fourth phase change memory 302 is 10 kΩ. During read operation, a read pulse with an amplitude of 200 mV and a width of 10 ms is applied to the first end of the third phase change memory 301 and the first end of the fourth phase change memory 302, and an output signal with an amplitude of 101 mV and a width of 10 ms is obtained at the second end of the third phase change memory 301. When logic 10 is input, resistance of the third phase change memory 301 is 10 kΩ and resistance of the fourth phase change memory 302 is 200 kΩ. During read operation, a read pulse with an amplitude of 200 mV and a width of 10 ms is applied to the first end of the third phase change memory 301 and the first end of the fourth phase change memory 302, and an output signal with an amplitude of 101 mV and a width of 10 ms is obtained at the second end of the third phase change memory 301. When logic 11 is input, resistance of the third phase change memory 301 is 10 kΩ and resistance of the fourth phase change memory 302 is also 10 kΩ. During read operation, a read pulse with an amplitude of 200 mV and a width of 10 ms is applied to the first end of the third phase change memory 301 and the first end of the fourth phase change memory 302, and an output signal with an amplitude of 133 mV and a width of 10 ms is obtained at the second end of the third phase change memory 301.

Figure 6:
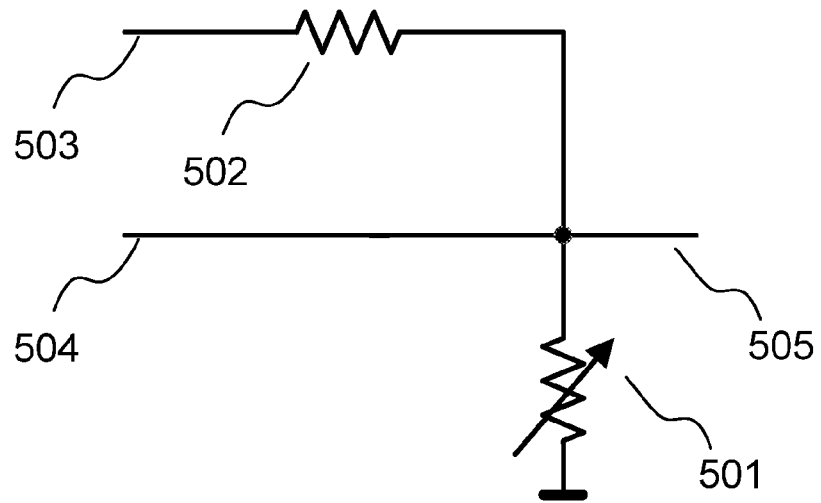
FIG. 6 is a schematic diagram of a NOT gate circuit according to one embodiment of the invention.

FIG. 6 is a schematic diagram of a NOT gate circuit based on phase change memories according to one embodiment of the invention. Referring to FIG. 6, the NOT gate circuit based on phase change memories comprises a fifth phase change memory 501 and a third resistor 502, wherein a first end 503 of the third resistor 502 serves as a read input end of the NOT gate circuit, a first end 504 of the fifth phase change memory 501 serves as a logic input end and an output end, and the third resistor 502 and the fifth phase change memory 501 are grounded in series.

Logic operation is realized by inputting logic 0 or 1 at the first end 504 of the fifth phase change memory 501, thereby bringing the fifth phase change memory 501 to a high-resistance state or a low-resistance state.

Read operation is carried out by inputting a read pulse at the first end of the third resistor 502 and outputting a result of operation through the first end 504 of the fifth phase change memory 501.

According to the embodiment of the invention, resistance of the third resistor 502 is in the same order of magnitude as that of the fifth phase change memory 501 in a high-resistance state. When the fifth phase change memory 501 is in a low-resistance state, namely logic 1 is input, voltage drop applied to the read input end is mainly imposed on the third resistor 502 and output voltage drop of the fifth phase change memory 501 is extremely low. Only when the fifth phase change memory 501 is in a high-resistance state, namely logic 0 is input, resistance of the fifth phase change memory 501 is comparatively high and is in the same order of magnitude as that of the third resistor 502, and output voltage drop of the fifth phase change memory is comparatively high.

Figure 7:
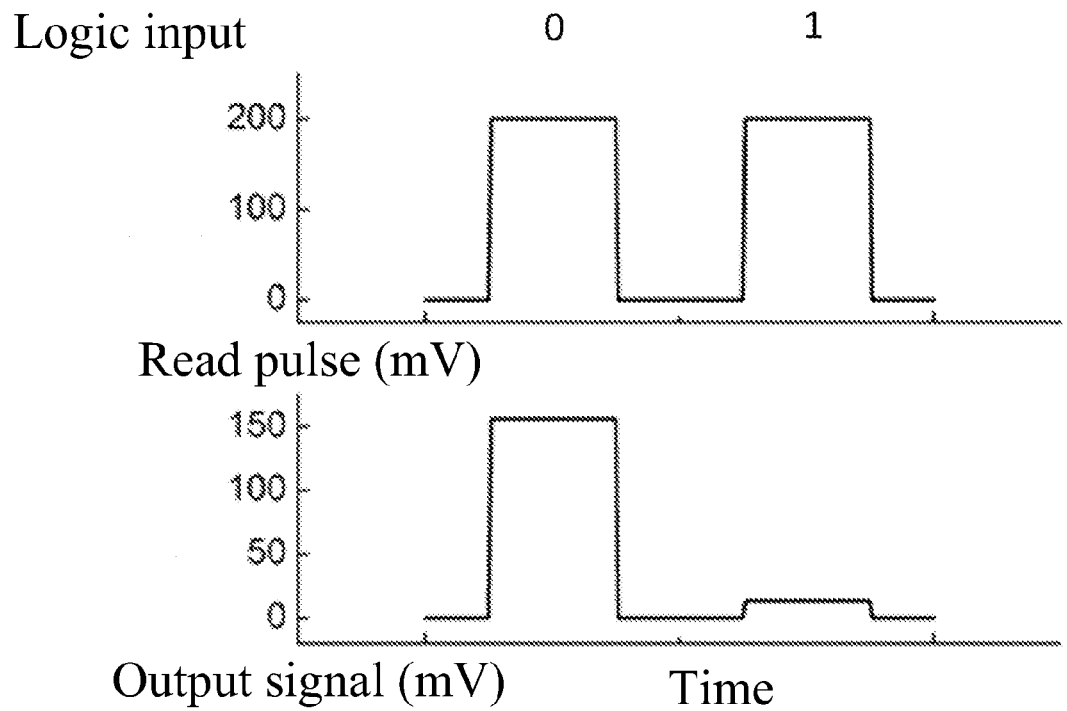
FIG. 7 illustrates testing waves of the NOT gate circuit according to one embodiment of the invention.

FIG. 7 illustrates testing waves of the NOT gate circuit according to one embodiment of the invention. Resistances of the fifth phase change memory 501 in a high-resistance state and a low-resistance state are 200 kΩ and 10 kΩ respectively, and resistance of the third resistor 502 is 140 kΩ. A SET pulse representing logic 1 is a rectangular wave with an amplitude of 0.8 V and a width of 200 ns, and a RESET pulse representing logic 0 is also a rectangular wave with an amplitude of 2 V and a width of 30 ns.

Referring to FIG. 7, when logic 0 is input, resistance of the fifth phase change memory 501 is 200 kΩ. During read operation, a read pulse with an amplitude of 200 mV and a width of 10 ms is applied to the first end of the third resistor 502, and an output signal with an amplitude of 156 mV and a width of 10 ms is obtained at the first end 504 of the fifth phase change memory 501. When logic 1 is input, resistance of the fifth phase change memory 501 is 10 kΩ. During read operation, a read pulse with an amplitude of 200 mV and a width of 10 ms is applied to the first end of the third resistor 502, and an output signal with an amplitude of 13.3 mV and a width of 10 ms is obtained at the first end 504 of the fifth phase change memory 501.

Operation results of logic gate circuits of the invention may be stored in the circuits without volatility, wherein both data processing and storage are carried out in a single unit or circuit. Logic operation is realized based on stability and reversibility of phase change of an element, which may effectively decrease misoperations of logic operations and ensure reliability and reproducibility thereof. Besides, AND, OR and NOT are parallel operations which require only one step to be realized and therefore are concise and highly efficient.

While preferred embodiments of the invention have been described above, the invention is not limited to disclosure in the embodiments and the accompanying drawings. Any changes or modifications without departing from the spirit of the invention fall within the scope of the invention.

The invention claimed is:

1. A nonvolatile logic gate circuit, comprising:
a first phase change memory;
a second phase change memory;
a first controllable switch element; and
a first resistor;
wherein:
a first end of said first phase change memory serves as a first input end of an AND gate circuit, a first end of said second phase change memory serves as a second input end of the AND gate circuit;
a first end of said first controllable switch element is connected to a second end of said first phase change memory and a second end of said second phase change memory, and a second end of said first controllable switch element is grounded;
one end of said first resistor is connected to the first end of said second phase change memory, the other end of said first resistor is grounded;
the first end of said second phase change memory serves as an output end of the AND gate circuit;
in operation, logic AND operation is realized by turning on said first controllable switch element, and inputting logic 0 or 1 at said first input end, thereby bringing said first phase change memory to a high-resistance state or a low-resistance state, and inputting logic 0 or 1 at said second input end, thereby bringing said second phase change memory to a high-resistance state or a low-resistance state; and
read operation is carried out by turning off said first controllable switch element, inputting a read pulse at said first input end, and outputting a result of AND operation through said output end of the AND gate circuit while said second input end is suspended.

2. The nonvolatile logic gate circuit of claim 1, wherein resistance of said first resistor is in the same order of magnitude as that of said first phase change memory in a low-resistance state.

3. A nonvolatile logic gate circuit, comprising:
a third phase change memory;
a fourth phase change memory;
a second controllable switch element; and
a second resistor;

wherein:
a first end of said third phase change memory serves as a first input end of an OR gate circuit, a first end of said fourth phase change memory) serves as a second input end of the OR gate circuit;
a first end of said second controllable switch element is connected to a second end of said third phase change memory and a second end of said fourth phase change memory, and a second end of said second controllable switch element is grounded;
a first end of said second resistor is connected to the second end of said third phase change memory and the second end of said fourth phase change memory, a second end of said second resistor is grounded;
the second end of said third phase change memory serves as an output end of the OR gate circuit;
in operation, logic OR operation is realized by turning on said second controllable switch element, and inputting logic 0 or 1 at said first input end, thereby bringing said third phase change memory to a high-resistance state or a low-resistance state, and inputting logic 0 or 1 at said second input end, thereby bringing said fourth phase change memory to a high-resistance state or a low-resistance state; and
read operation is carried out by turning off said second controllable switch element, inputting a read pulse simultaneously at said first input end and said second input end, and outputting a result of OR operation through said output end of the OR gate circuit.

4. The nonvolatile logic gate circuit of claim 3, wherein resistance of said second resistor is in the same order of magnitude as that of said third phase change memory in a low-resistance state.

* * * * *